United States Patent
Pfeiffer et al.

(10) Patent No.: US 7,402,779 B2
(45) Date of Patent: Jul. 22, 2008

(54) EFFUSION CELL AND METHOD FOR USE IN MOLECULAR BEAM DEPOSITION

(75) Inventors: Loren N. Pfeiffer, Harding Township, Morris County, NJ (US); Kenneth William West, Mendham Township, Morris County, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 321 days.

(21) Appl. No.: 10/890,046

(22) Filed: Jul. 13, 2004

(65) Prior Publication Data

US 2006/0011609 A1 Jan. 19, 2006

(51) Int. Cl.
- H05B 3/04 (2006.01)
- F27B 14/14 (2006.01)
- C23C 16/00 (2006.01)
- C23C 14/00 (2006.01)

(52) U.S. Cl. .................. 219/422; 219/424; 219/426; 118/726

(58) Field of Classification Search ............... None
See application file for complete search history.

(56) References Cited

U.S. PATENT DOCUMENTS

| | | | | |
|---|---|---|---|---|
| 4,239,955 A | 12/1980 | Cho | | 219/271 |
| 4,553,022 A | 11/1985 | Colombo | | 219/275 |
| 4,748,315 A * | 5/1988 | Takahashi et al. | | 392/388 |
| 5,031,229 A * | 7/1991 | Chow | | 392/389 |
| 5,034,604 A * | 7/1991 | Streetman et al. | | 250/251 |
| 5,041,719 A * | 8/1991 | Harris et al. | | 219/390 |
| 5,253,266 A * | 10/1993 | Knodle et al. | | 373/10 |
| 5,308,399 A * | 5/1994 | Pillhoefer et al. | | 118/719 |
| 6,337,105 B1 * | 1/2002 | Kunieda et al. | | 427/248.1 |

(Continued)

FOREIGN PATENT DOCUMENTS

JP 61272368 A * 12/1986

(Continued)

OTHER PUBLICATIONS

J. N. Miller, "Flux Noise . . . ," *J. Vac. Sci. Tech. B*, vol. 10, No. 2, pp. 803-806 (Mar./Apr. 1992).

(Continued)

*Primary Examiner*—Joseph M Pelham (57) ABSTRACT

An MBE effusion cell is configured to produce an inverted temperature gradient; that is, the top surface of the melt is not cooler than the bottom surface of the melt. In one embodiment, the MBE effusion cell comprises a crucible having tip, central and base regions. First filaments are located laterally adjacent the tip region; second filaments are located laterally adjacent the central region; and third filaments are located laterally adjacent all three of the regions. The radial density of the number of the heater filaments is lower adjacent the base region than adjacent the tip or central regions. In another embodiment, further tailoring of the inverted temperature gradient is obtained by reducing the amount of insulation at the base of the crucible. In another embodiment, at least one heater filament extends substantially along the longitudinal axis of the crucible and is located adjacent its lateral wall. Dielectric annular spacers are located around the lateral wall and are distributed along the longitudinal axis. The spacers having a multiplicity of holes through which the filaments pass. The filaments and spacers are located within a gas-blocking enclosure.

20 Claims, 4 Drawing Sheets

U.S. PATENT DOCUMENTS

| | | | |
|---|---|---|---|
| 6,511,759 B1 * | 1/2003 | Schalansky | 428/576 |
| 6,830,626 B1 * | 12/2004 | Smith | 118/726 |
| 2002/0197418 A1 * | 12/2002 | Mizukami et al. | 427/596 |
| 2005/0034672 A1 * | 2/2005 | Lee et al. | 118/726 |

FOREIGN PATENT DOCUMENTS

| | | | |
|---|---|---|---|
| JP | 05044020 A | * | 8/1991 |
| JP | 05155695 A | * | 6/1993 |
| JP | 06299336 A | * | 10/1994 |

OTHER PUBLICATIONS

EPI MBE Products Group, "High Performance Components To Make the Most of Your MBE System: 2000 Product Guide," pp. 42-44, 49-52, 54-56, 59.

* cited by examiner

EFFUSION CELL AND METHOD FOR USE IN MOLECULAR BEAM DEPOSITION

BACKGROUND OF THE INVENTION

1. Field of the Invention

This invention relates to molecular beam deposition of layers of material and, more particularly, to effusion cells and methods for their use in the molecular beam epitaxial (MBE) growth of such materials.

2. Discussion of the Related Art

Molecular beam deposition of layers of material (e.g., semiconductors, metals, insulators, or superconductors) on a heated substrate in an ultra high vacuum is well known in the art. In particular, MBE is one of the principal techniques used in the semiconductor device industry to fabricate high quality, single crystal, semiconductor layers with thickness control on the order of a monolayer. In MBE a single crystal substrate or wafer is placed in a vacuum chamber where it is heated. Effusion cells loaded with source materials are used to generate beams of constituent atoms, which are directed at the substrate. The constituent atoms adsorb on the substrate surface and incorporate into the underlying crystal structure to form a semiconductor layer. Control is so good that the layer is literally formed one monolayer at a time.

Although the term molecular is used to describe the source material in this deposition process, those skilled in the art understand that the source material may be in elemental (or atomic) as well as compound (or molecular).

In the growth of Group III-V compound semiconductor layers, for example, the crucible of one effusion cell would contain a Group III metal (e.g., liquid Ga) and the crucible of another cell would contain a Group V material (e.g., elemental As, or less commonly polycrystalline GaAs). One persistent problem in MBE technology is that droplets of Ga, which form on the cooler tip end of the Ga crucible, become encapsulated with a thin surface layer of GaAs. It is believed that the GaAs-encapsulated Ga droplet can then explode causing small Ga deposits to be spattered onto the growth surface of the substrate. These adsorbed Ga spatters disrupt the crystal symmetry of the growing layer and hence are undesirable in high quality Group III-V compound semiconductor layers.

BRIEF SUMMARY OF THE INVENTION

In addition to the problem of exploding droplets, we have discovered other problems that contribute to the degradation of the quality of semiconductor layers grown by MBE. These discoveries have led us to modify the effusion cell design. In accordance with one aspect of our invention, an MBE effusion cell is configured to produce an inverted temperature gradient; that is, the top surface of the melt is not cooler than the bottom surface or base of the melt. In one embodiment, the MBE effusion cell comprises a crucible having tip, central and base regions. A multiplicity of heater filaments extend along the longitudinal axis of the crucible: first filaments are located laterally adjacent the tip region; second filaments are located laterally adjacent the central region; and third filaments are located laterally adjacent all three of the regions. The radial density of the number of the heater filaments is lower adjacent the base region than adjacent the tip or central regions. In another embodiment, further tailoring of the inverted temperature gradient is obtained by reducing the amount of insulation at the base of the crucible.

In accordance with another aspect of our invention, an MBE effusion cell includes a crucible having lateral and end walls that from a cylindrical cavity. At least one heater filament extends substantially along the longitudinal axis of the crucible and is located adjacent its lateral wall. Dielectric annular spacers are located around the lateral wall and are distributed along the longitudinal axis. The spacers having a multiplicity of holes through which the filaments pass. The filaments and spacers are located within a gas-blocking enclosure.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

General MBE Apparatus

Figure 1:
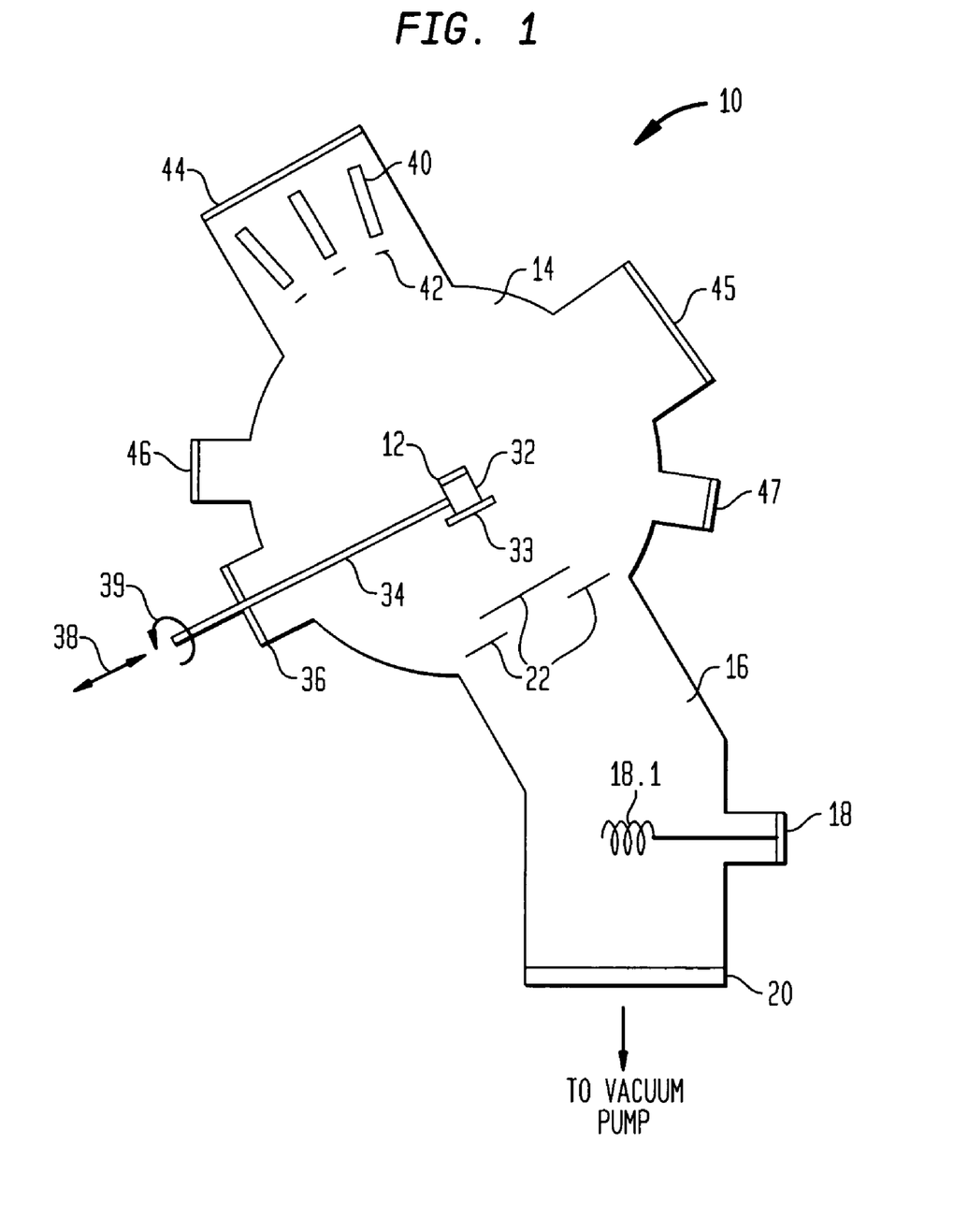
FIG. 1 is a schematic view of MBE apparatus.

Before discussing our invention in detail, we first turn to FIG. 1, which shows a well known ultra-high vacuum apparatus 10 for the molecular beam deposition of layers of, for example, semiconductor materials sequentially on a substrate 12. The apparatus 10, which is typically made of stainless steel, comprises a growth chamber 14 and a pump chamber 16. The growth chamber 14 is provided with a multiplicity of ports, which serve a variety of functions. For example, manipulator port 36 is used to position the substrate 12, oven port 44 is used to generate molecular beams, and viewing port 45 is used to visually observe the substrate. Additional ports 46 or 47 may be used to couple ion gauges (not shown) to the growth chamber. Illustratively, one ion gauge is used to monitor the chamber pressure; another is used to measure atomic or molecular beam flux.

Vacuum conditions (e.g., $10^{-9}$ to $10^{-12}$ torr) are achieved and maintained in the growth chamber 14 by suitable pumping means, typically a Ti sublimation pump 18 coupled to a commercially available cryogenic vacuum pump (not shown) via port 20. The sublimation pump 18 includes a Ti element 18.1 positioned within a cryogenically cooled (e.g., liquid nitrogen) first shroud (not shown). A multiplicity of staggered, liquid-nitrogen-cooled baffles 22 block line-of-sight paths between element 18.1 and substrate 12.

The substrate 12 is mounted on a holder 32 and is heated by means of a suitable heater 33. Holder 32 is in turn secured to a manipulator illustrated as a rod 34 that extends through port 36 to the exterior of the apparatus. Arrows 38 and 39 indicate that the rod, and hence the substrate, may be translated or rotated, or both, into a desired position within the growth chamber. Typically the substrate is surrounded by a cryogenically cooled second shroud (not shown), which is apertured to allow access to the substrate surface by growth and test beams and for visual inspection.

As shown in FIG. 1, the manipulator has been used to locate the substrate 12 in a growth position. In this position substrate 12 faces a multiplicity of shuttered effusion cells 40, which are located in oven port 44 and are each surrounded by cryogenically cooled third shrouds (not shown). Cells 40 are loaded with source materials typically in a liquid or solid state, although in some cases the source materials may be gaseous. (In a liquid state, the source material is commonly referred to as a melt.) When suitably heated and the shutters 42 are opened, the solid or liquid source materials evaporate to form a multiplicity of beams of constituent materials (known as molecular beams) that are adsorbed onto the heated substrate 12 where they form, for example, a semiconductor layer. Depending on the growth conditions and the nature of the substrate 12, the deposited semiconductor layer may be monocrystalline (single crystal), polycrystalline or amorphous. Although our invention is primarily concerned with high quality, monocrystalline, semiconductor layers, our effusion cells may also be used to fabricate semiconductor layers that are not monocrystalline or to fabricate non-semiconductor materials such as metals, insulators or superconductors.

Although modern designs of MBE apparatus have evolved considerably in the last 25 years, many of the features of a basic MBE apparatus are described by A. Y. Cho in U.S. Pat. No. 4,239,955 issued on Dec. 16, 1980, which is incorporated herein by reference.

Effusion Cell Design: Inverted Temperature Gradient

Figure 2:
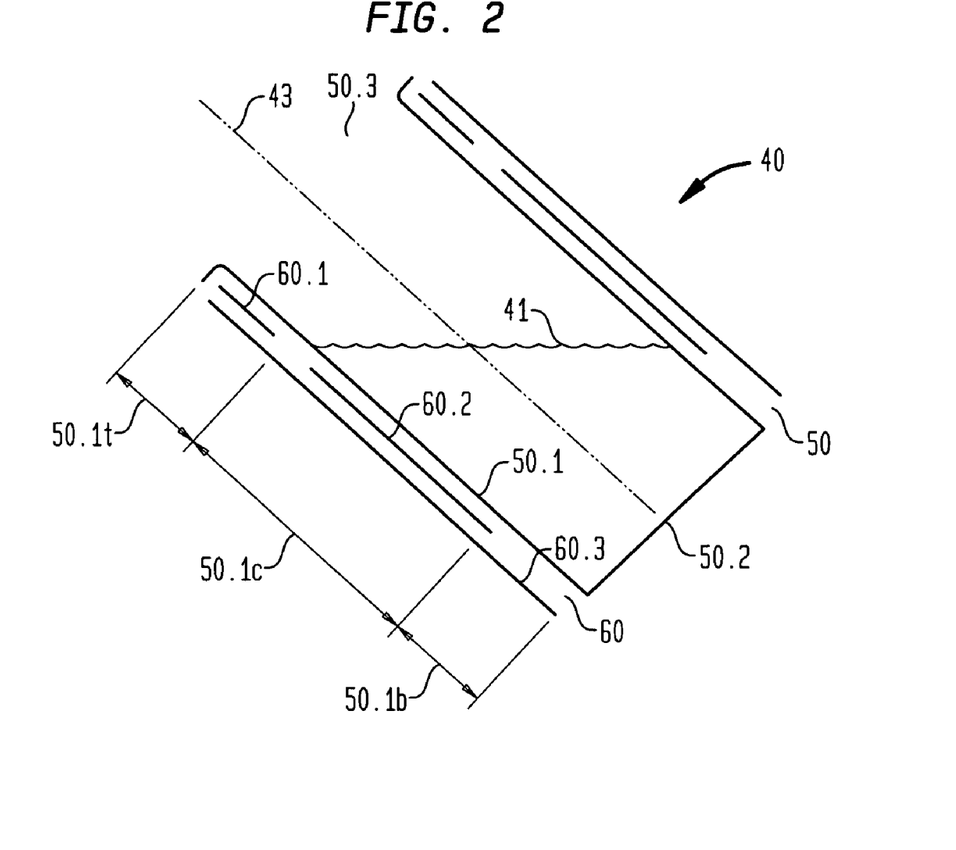
FIG. 2 is a schematic, cross sectional view of an MBE effusion cell in accordance with one embodiment of our invention.

In accordance with one aspect of our invention, an MBE effusion cell, as shown in FIG. 2, is configured to produce an inverted temperature gradient (or no temperature gradient at all) in the source melt; that is, the top surface of the melt is not cooler than the bottom surface or base of the melt. Two features of our MBE effusion cell cooperate to produce the desired temperature gradient: (1) a unique arrangement of heater filaments; and (2) the amount of insulation at the base of the cell.

Illustratively, the MBE effusion cell 40 comprises a crucible 50 for containing a source material 41, typically a liquid metal or melt such as Ga. Crucible 50, which has the geometric shape of a cylinder that is closed at one end and open at the other, has a side or lateral wall 50.1 and an end or base wall 50.2. The lateral wall 50.1 can be viewed as being divided into three regions along the longitudinal axis 43 of the crucible: a tip region 50.1t adjacent the open end 50.3, a base region 50.1b adjacent the closed or base end 50.2, and a central region 50.1c between the tip region 50.1t and the base region 50.1b.

Figure 3:
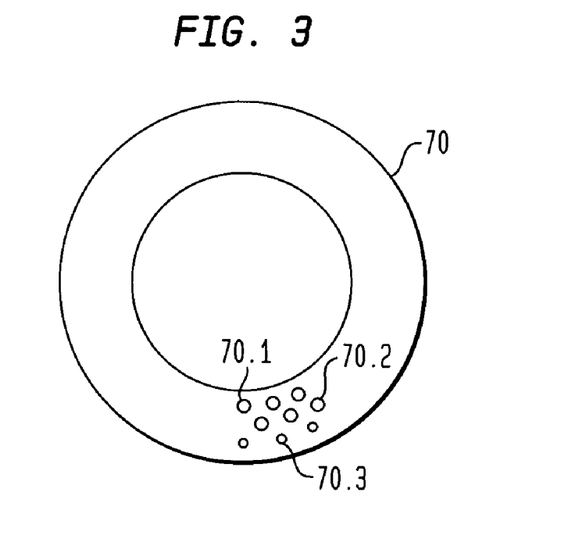
FIG. 3 is a schematic view of an annular spacer for use in one embodiment of our invention.
Figure 4:
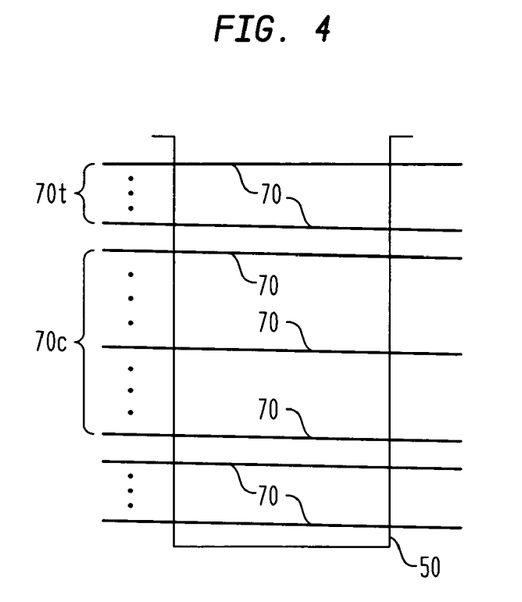
FIG. 4 is a schematic view of an effusion cell showing illustrative positions of spacers of the type depicted in FIG. 3.
Figure 5:
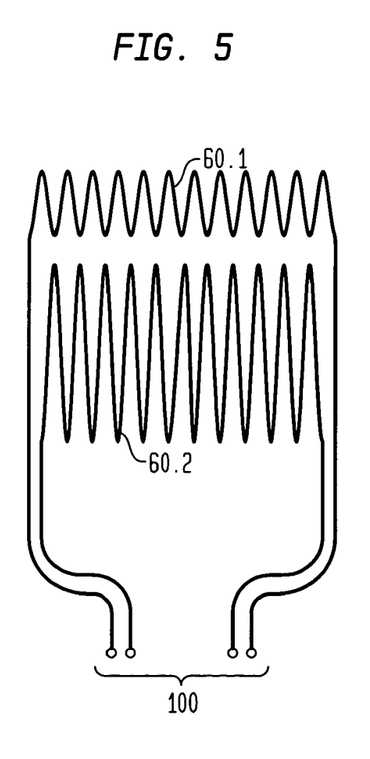
FIGS. 5-6 are schematic views of the filaments in accordance with one embodiment of our invention. The filaments are shown in two dimensions only, but in practice they surround or wrap around the cylindrical outer surface of the effusion cell crucible.
Figure 6:
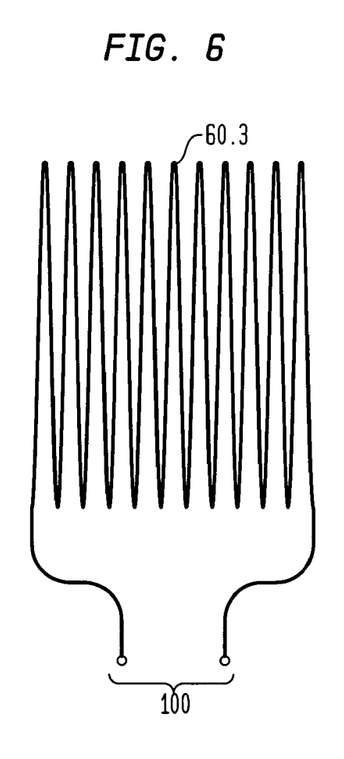

In order to heat the source material 41 to a sufficiently high temperature to produce evaporation (i.e., a molecular beam), effusion cell 40 is provided with a multiplicity of heater filaments (e.g., 60.1, 60.2 and 60.3), which are shown in FIGS. 2, 5, 6 and 8. These filaments wind back and forth along the longitudinal axis 43 in serpentine fashion and surround or wrap around particular portions of the cylindrical lateral surface 50.1. The filaments are held in place by a multiplicity of annular spacers 70, which are shown in FIGS. 3 and 4. In a preferred embodiment, the arrangement of filaments includes inner filaments 60.1 and 60.2 and outer filament 60.3. Furthermore, inner filament 60.1 is located adjacent only the tip region 50.1t, and inner filament 60.2 is located adjacent only the central region 50.1c, whereas outer filament 60.3 is located adjacent all three of the regions 50.1t, 50.1c and 50.1b. In this design the radial density of the number of filaments is lower adjacent the base region than adjacent either the tip region or the central region. This feature is apparent from the fact that no inner filament is adjacent the base region 50.1b.

In a further preferred embodiment the filaments 60.1, 60.2 and 60.3 pass through holes in the annular spacers, and the holes are arranged in a particular pattern. More specifically, as shown in FIG. 3, each spacer 70 is provided with a multiplicity of first holes 70.1 located along the circumference of an inner circle (inner filaments 60.1 and 60.2 pass through holes 70.1, but do so in different subsets 70t and 70c of spacers, as shown in FIG. 4), a multiplicity of second holes 70.2 located along the circumference of a middle circle having a diameter greater than the inner circle (outer filament 60.3 passes through holes 70.2), and a multiplicity of third holes 70.3 located along the circumference of an outer circle having a diameter greater than that of the middle circle (wires for thermocouples etc pass through holes 70.3).

In addition, the position of the middle holes 70.2 and the inner holes 70.1 preferably satisfy several conditions: (1) the inner and middle holes are offset relative to one another; that is, they are positioned at different azimuthal angles as measured from the center of the annular spacer; (2) the inner and middle holes are periodically spaced along the circumference of their respective circles, and the middle holes 70.2 are offset from the inner holes 70.1 by approximately half the pitch of the inner holes; and (3) the spacing of the inner holes 70.1 from one another (i.e., their pitch), and likewise the pitch of the middle holes 70.2, is approximately equal to twice the diameter of the inner and middle holes; that is, the arrangement of the inner and middle holes and the diameter of the corresponding filaments is such that the open spacing between adjacent filaments is essentially equal to their diameter.

Figure 8:
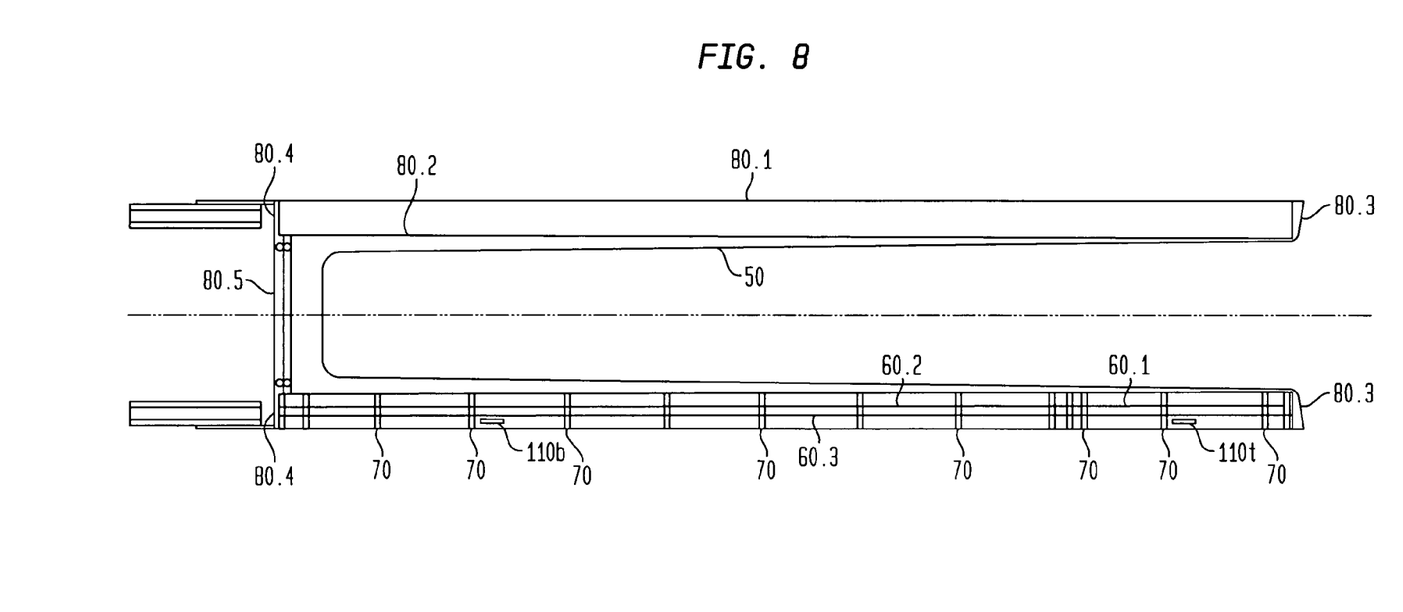
FIG. 8 is a cross-sectional view of an effusion cell in accordance with yet another embodiment of our invention.

In another embodiment of this aspect of our invention, realization of the desired inverted temperature gradient is facilitated by reducing the amount of insulation at the base end of the cell, thereby allowing heat to escape more readily from that end, which in turn lowers the temperature of the base end. As illustrated in FIG. 8, insulation 80.5 is positioned at the base end of the cell. For exemplary purposes only three layers of insulation, separated by two layers of wire spacers, are depicted. Fewer than three layers of insulation (or none at all), may be used depending on how many are needed to produce the desired inverted temperature gradient. Typically the layers of insulation and the wire spacers comprises tantalum (Ta), although other materials are also suitable.

In order to determine whether the desired inverted temperature gradient has been achieved, the cell is provided with temperature sensors (e.g., thermocouples) within the enclosure. Illustratively, sensor 110b is located near the base region, and sensor 110t is located near the tip region, as shown in FIG. 8. These sensors provide a coarse measure of the temperature at the base and tip ends of the cell. A more accurate technique for determining whether the desired gradient has been achieved is to measure the flux noise from the cell. If this noise parameter is reduced sufficiently, the desired gradient is obtained. Techniques for measuring the flux noise are well known in the art. See, for example, J. N. Miller, *J. Vac. Sci Technol. B*, Vol. 10, No. 2, pp. 803-806 (1992), which is incorporated herein by reference.

Effusion Cell Design: Gas-Blocking Enclosure

Figure 7:
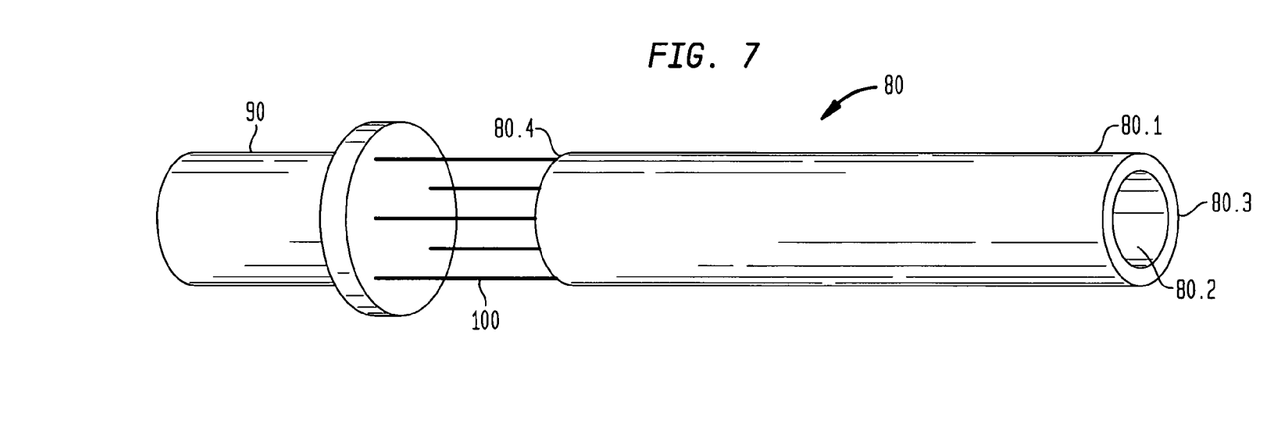
FIG. 7 is a schematic, isometric view of an effusion cell within a gas-blocking enclosure in accordance with another embodiment of our invention.

In accordance with another aspect of our invention, an effusion cell having dielectric annular spacers to secure the position of at least one heater filament includes a gas-blocking enclosure 80, as shown in FIGS. 7 and 8. The spacers and the filament, but not the crucible, are located within the enclosure. Preferably the effusion cell utilizes a multiplicity of filaments arranged as discussed above in conjunction with FIGS. 2-6. The enclosure may be made of any material that (i) can be formed into the shape of the desired enclosure; (ii) can withstand the heat generated by the filaments; and (iii) prevents any significant amount of deleterious gas generated within the enclosure from reaching the growth substrate. Illustratively the material is a metal, such as Ta foil, that can be welded to produce a gas tight seal at the mouth or tip end of the cell. Thus, essentially all gas evolving from the heater assembly (e.g., filaments, spacers) escapes only from the back end of the cell, where it is trapped by cryogenic shrouds and is pumped out of the chamber before reaching the growth substrate. More specifically, the enclosure may be formed by a first Ta foil 80.1 in the shape of an outer cylinder and second Ta foil 80.2 in the shape of an inner cylinder. The two cylindrical foils are welded together around the entire circumference of at least the tip end 80.3 to form a gas-blocking enclosure. (In contrast, these two foils of effusion cells that were commercially available from Varian Associates in the 1980s were spot welded, thereby allowing gas escaping from the leaky enclosure to reach the growth substrate.)

Theory

In the following exposition we provide our current understanding of how various problems are addressed by some of the features of our effusion cell in order to assist those skilled in the art to understand its operation, but the exposition is not intended to limit the scope of the invention. For purposes of illustration we assume the source material is liquid Ga, the spacers comprise pyrolytic boron nitride (PBN), and the filaments are made of Ta wire.

First, when a liquid metal source material, such as Ga, is heated in an effusion cell, generally the bottom surface of the Ga liquid (melt) is hotter than its top surface. The resulting temperature gradient creates convention currents in the liquid and leads to flux noise, as discussed by J. N. Miller, supra. Miller theorizes that the flux noise has two potential sources: hydrodynamic instabilities of the liquid and source spitting. Spitting occurs when heated, GaAs-encapsulated Ga droplets, which form on the inside walls of the crucible near its open end, or indeed the GaAs-encapsulated Ga melt surface itself, fissure and explode causing tiny spatters of Ga to land on and stick to the growth surface of the substrate, where they disrupt the crystal symmetry of the Ga-containing semiconductor layer being deposited or grown. Second, we believe that when the power level in a Ta filament is sufficiently high, the portions of the PBN spacer material in contact with the filament decompose or break down, releasing nitrogen gas into the growth chamber. Nitrogen incorporated into the semiconductor layer acts as a deep donor or electron trap that reduces the electron mobility of the layer. (A similar problem would occur with the decomposition of $Al_2O_3$ spacer material and the incorporation of oxygen into the semiconductor layers.)

A unique arrangement of the heater filaments of our effusion cell addresses the spitting problem: (1) the cell is provided with a separate tip heater filament 60.1, which allows the tip end of the crucible to be made sufficiently hotter than the base end, so that Ga droplets can be evaporated before MBE growth and, therefore, before they explode onto the growth surface; and (2) the central heater filament 60.1 does not extend over the base region 50.1b, thus alleviating the problem of prior art effusion cells—a melt in which its top surface is cooler than its bottom or base. Note, although the outer heater filament 60.3 does extend over the base region, it is operated at sufficiently low power that the desired inverted temperature gradient (not cooler at the top than at the bottom) can still be maintained.

If necessary, additional tailoring of the inverted temperature gradient in the melt can be obtained by reducing the amount of insulation at the base end of the effusion cell; e.g., by reducing the number of Ta layers (foils) 80.5, as discussed earlier.

In addition, several features of our effusion cell combine to address the spacer decomposition problem: (1) outer filament 60.3 provides sufficient additional heat to allow the combination of the inner filaments 60.1 and 60.2 and the outer filament 60.3 to be operated at lower local temperatures for a given total power, thereby reducing the amount of PBN breakdown in the regions where the filaments touch the PBN spacers and, therefore, reducing the amount of nitrogen released; (2) gas-blocking enclosure 80 prevents most of the nitrogen released from entering the growth chamber and hence from being incorporated into the grown layers; and (3) the total surface area of the three filaments is increased so that the local filament temperature is decreased for a given amount of thermal energy dissipated by the filaments. Total surface area is increased by: (3a) increasing the diameter of the filaments 60.1 and 60.2 to, for example, 40 mils compared to 25 mils typical of the prior art; (3b) spacing the filaments 60.1 and 60.2 more closely by making their pitch approximately equal to twice the filament diameter (e.g., 40 mils) compared to a pitch of around 100 mils in the prior art; and (3c) offsetting the filaments 60.1 and 60.2 from one another.

Because the breakdown or decomposition of PBN into boron and a nitrogen-containing gas is temperature driven, reducing the maximum temperature of the filaments reduces the amount of PBN decomposition.

In operation, the tip filament 60.1 may be heated off-line after MBE growth to evaporate any Ga droplets that may have accumulated during the growth process. Note, the concentrated heat on the PBN spacers during this heating step is not a problem because the nitrogen gas that evolves is harmlessly pumped away before the next stage of the growth process. In addition, during MBE growth, all three of the filaments are typically powered to maintain an essentially uniform Ga melt temperature profile with the top of the melt (Ga evaporation surface) slightly warmer than the remainder of the melt. A second purpose of this mode of operation is to reduce the number of hot spots in the filaments so that the temperature of all filaments is as low as possible consistent with the desired evaporation rate and the with the maintenance of the Ga melt temperature profile discussed above.

Illustration

The following design parameters illustrate the construction of a Ga effusion cell in accordance with an illustrative embodiment of our invention. Various materials, dimensions and operating conditions are provided by way of illustration only and, unless otherwise expressly stated, are not intended to limit the scope of the invention.

Effusion cell 40: OD of 1.6" and crucible mouth opening 50.3 of 0.92."

Enclosure 80: made of Ta foil.

Crucible 50: length of 7.5 inch and diameter of 1.0 inch. This design combines a small effusion mouth with a large usable Ga capacity in excess of 220 gm if mounted 30° upwardly with respect to the horizontal.

Filaments: Ta wire having OD of 0.040" (40 mils).

Tip filament 60.1: 42 segments each 1.5" long; each segment on a 1.165" B.C, where "B.C." means bolt circle, a mechanical engineering term for the diameter of the circle on whose circumference the centers of the holes are located.

Central filament 60.2: 42 segments each 4.0" long; each segment on a 1.165" B.C.

Outer filament 60.3: 42 segments each 7.5" long; each segment on a 1.300" B.C.

Segments of outer filament 60.3 are offset from segments of the inner (tip and central) filaments by one-half the pitch of the inner filaments.

Tip filament 60.1, central filament 60.2, and outer filament 60.3 may be each powered separately or may be electrically connected in series with one another.

Thermocouples: 42 holes 70.3 equally spaced on a 1.408" B.C. Thermocouples 110b and 110c may be operated in servo feedback mode.

Annular spacers: made of 0.035" thick PBN with OD of 1.48" and ID of 1.02." 42 equally spaced holes 70.1 of 0.045" diameter on a 1.165" B.C.; 42 equally spaced holes 70.2 of 0.045" diameter on a 1.300" B.C.; and 42 equally spaced holes 70.3 of 0.025" diameter on a 1.408" B.C. One technique of fixing the longitudinal distance between spacers is to use short lengths of metal wire in compression, opposed to other wires in tension. Typically these wires comprise a low vapor pressure, refractory metal that can be shaped. Suitable metals include Ta, Ta alloys and W.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

We claim:

1. An effusion cell comprising:
   a crucible having lateral and end walls that form a cavity; said cavity having a longitudinal axis, a closed end and an open end; said lateral wall having a base longitudinal region adjacent said closed end, a tip longitudinal region adjacent said open end, and a central longitudinal region between said base and tip regions;
   first heater filaments extending substantially along said axis and being located laterally adjacent said tip region;
   second heater filaments extending substantially along said axis and being located laterally adjacent said central region; and
   third heater filaments extending substantially along said axis and being located laterally adjacent all of said regions;
   wherein the radial density of the number of said heater filaments is lower adjacent said base region than adjacent said tip or central regions, and
   further including a multiplicity of dielectric annular spacers located around said lateral wall and distributed along said longitudinal axis;
   each of said spacers having a first and second ring of holes, said first ring being located closer to said axis than said second ring,
   wherein said first filaments pass through the holes of said first ring in a first subset of said spacers, said second filaments pass through the holes of said first ring in a second subset of said spacers, and said third filaments pass through the holes of said second ring.

2. The effusion cell of claim 1, wherein the holes of said first and second rings have azimuthal angles that are offset with respect to one another.

3. The effusion cell of claim 2, wherein the holes in each of said first and second rings are periodically spaced around the circumference of said ring, and wherein said offset corresponds approximately to one-half the pitch of said periodic spacing.

4. The effusion cell of claim 3, wherein in each of said first and second rings the arrangement of said holes and the diameter of said filaments are designed so that the spacing of said filaments is approximately equal to the diameter of said filaments.

5. The effusion cell of claim 1, further including a gas-blocking enclosure, said filaments and said spacers being located within said enclosure.

6. The effusion cell of claim 4, wherein said dielectric spacers comprise a nitrogen compound and said enclosure blocks nitrogen-containing gas.

7. The effusion cell of claim 5, wherein said dielectric spacers comprise boron nitride.

8. The effusion cell of claim 5, wherein said enclosure comprises a metal.

9. The effusion cell of claim 8, wherein said metal comprises tantalum foil.

10. The effusion cell of claim 1, further including a temperature sensor located adjacent at least one of said regions.

11. The effusion cell of claim 10, further including a temperature sensor located adjacent said base region and a temperature sensor located adjacent said tip region.

12. A molecular beam deposition apparatus comprising
    a vacuum chamber,
    a holder for carrying a substrate on which layers of material are to be grown,
    a multiplicity of effusion cells for carrying source materials from which said layers are to be grown, characterized in that
    at least one of said multiplicity comprises an effusion cell according to claim 1.

13. A method of making a device comprising the steps of:
    (a) providing a molecular beam deposition apparatus comprising a vacuum chamber, a holder for carrying a substrate on which layers of material arc to be grown, a multiplicity of effusion cells for carrying source materials from which said layers are to be grown, characterized in that at least one of said multiplicity comprises an effusion cell according to claim 1, and
    (b) directing a beam of material from said at least one effusion cell onto said substrate to form thereon a layer of material.

14. An effusion cell comprising:
    a crucible having lateral and end walls that form a cavity; said cavity having a longitudinal axis, a closed end and an open end; said lateral wall having a base longitudinal region adjacent said closed end, a tip longitudinal region adjacent said open end, and a central longitudinal region between said base and tip regions;
    first heater filaments extending substantially along said axis and being located laterally adjacent said tip region;
    second heater filaments extending substantially along said axis and being located laterally adjacent said central region; and
    third heater filaments extending substantially along said axis and being located laterally adjacent all of said regions; wherein the radial density of the number of said heater filaments is lower adjacent said base region than adjacent said tip or central regions;

a multiplicity of boron nitride annular spacers located around said lateral wall and distributed along said longitudinal axis; each of said spacers having a first, second and third ring of holes, said first ring being located closest to said axis, said third ring being located farthest from said axis, and said second ring being located between said first and second rings; wherein said first filaments pass through the holes of said first ring in a first subset of said spacers, said second filaments pass through the holes of said first ring in a second subset of said spacers, and said third filaments pass through the holes of said second ring; wherein the holes of said first and second rings have azimuthal angles that are offset with respect to one another; wherein the holes in each of said first and second rings are periodically spaced around the circumference of said ring, and wherein said offset corresponds approximately to one-half the pitch of said periodic spacing; wherein in each of said first and second rings the arrangement of said holes and the diameter of said filaments are designed so that the spacing of said filaments is approximately equal to the diameter of said filaments;

a tantalum foil enclosure that blocks gaseous nitrogen, said filaments and said spacers being located within said enclosure, a temperature sensor located adjacent said base region and a temperature sensor located adjacent said tip region, and wires coupled to said sensors passing through the holes of said third ring.

15. An effusion cell comprising:

a crucible having lateral and end walls that form a cavity; said cavity having a longitudinal axis;

at least one heater filament extending substantially along said axis and being located adjacent said lateral wall;

a multiplicity of dielectric annular spacers located around said lateral wall and distributed along said longitudinal axis; said spacers having a multiplicity of holes through which said at least one filament passes; and a gas-blocking enclosure, said at least one filament and said spacers being located within said enclosure.

16. The effusion cell of claim 15, wherein said dielectric spacers comprise a nitrogen compound and said enclosure blocks nitrogen-containing gas.

17. The effusion cell of claim 16, wherein said dielectric spacers comprise boron nitride.

18. The effusion cell of claim 15, wherein said enclosure comprises a metal.

19. The effusion cell of claim 18, wherein said metal comprises tantalum foil.

20. An effusion cell comprising:

a crucible for containing source material, said crucible having an open end;

at least one heater filament for healing said source material to evaporation from said open end;

a multiplicity of dielectric spacers for supporting said at least one filament, said spacers emitting gas when heated; and an enclosure in which said at least one filament and said spacers are located, said enclosure being configured to block egress of said gas from the region thereof proximate said open end of said crucible.

* * * * *